United States Patent
Uya

(10) Patent No.: US 7,893,516 B2
(45) Date of Patent: Feb. 22, 2011

(54) BACKSIDE-ILLUMINATED IMAGING DEVICE AND MANUFACTURING METHOD OF THE SAME

(75) Inventor: Shinji Uya, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 274 days.

(21) Appl. No.: 12/126,592

(22) Filed: May 23, 2008

(65) Prior Publication Data

US 2008/0296720 A1 Dec. 4, 2008

(30) Foreign Application Priority Data

May 30, 2007 (JP) .......................... P2007-143804

(51) Int. Cl.
*H01L 31/00* (2006.01)
(52) U.S. Cl. .................. 257/460; 438/64; 257/E31.095
(58) Field of Classification Search ................. 257/460, 257/E31.095; 438/64
See application file for complete search history.

(56) References Cited

U.S. PATENT DOCUMENTS 6,872,992 B2 * 3/2005 Muramatsu ................. 257/228
7,288,428 B2 10/2007 Muramatsu et al.

FOREIGN PATENT DOCUMENTS

JP 6-350068 A 12/1994
JP 11-67823 3/1999
JP 2001-308092 11/2001
JP 2005-285988 A 10/2005
JP 2006-032561 A 2/2006
WO WO00/62344 10/2000
WO 03/096427 A1 11/2003

OTHER PUBLICATIONS

Office Action, Japanese Notification of Reasons for Refusal, Aug. 10, 2010.

* cited by examiner

*Primary Examiner*—Thao X Le
*Assistant Examiner*—Tanika Warrior
(74) *Attorney, Agent, or Firm*—Birch, Stewart, Kolasch & Birch, LLP

(57) ABSTRACT

A backside-illuminated imaging device, which performs imaging by illuminating light from a back side of a semiconductor substrate to generate electric charges in the semiconductor substrate based on the light and reading out the electric charges from a front side of the semiconductor substrate, is provided and includes: a back-side layer including an back-side element on the back side of the semiconductor substrate; a front-side layer including an front-side element on the front side of the semiconductor substrate; a support substrate above the front-side layer; a spacer, one end of which comes in contact with the front-side layer and the other end of which comes in contact with the support substrate, to form a space having a uniform distance between the semiconductor substrate and the support substrate; and an adhesive filled in at least a part of the space between the surface-side element formation layer and the support substrate.

3 Claims, 8 Drawing Sheets

BACKSIDE-ILLUMINATED IMAGING DEVICE AND MANUFACTURING METHOD OF THE SAME

This application is based on and claims priority under 35 U.S.C. §119 from Japanese Patent Application No. 2007-143804 filed May 30, 2007, the entire disclosure of which is herein incorporated by reference.

BACKGROUND OF THE INVENTION

1. Field of the Invention

The present invention relates to a backside-illuminated imaging device that illuminates light from the back side of a semiconductor substrate and reads electric charges, which are generated in the semiconductor substrate based on the light, from the front side of the semiconductor substrates, to perform imaging.

2. Description of Related Art

There has been proposed a backside-illuminated imaging device that illuminates light from the back side of a semiconductor substrate, accumulating electric charges, which are generated in the semiconductor substrate based on the light, in charge accumulating areas on the surface of the semiconductor substrate, and outputting a signal in accordance with the accumulated electric charges to the outside by a CCD circuit or a COMS circuit on the surface of the semiconductor substrate, to perform imaging.

The semiconductor substrate photoelectric conversion area) of the backside-illuminated imaging device is required to have a thickness of about 10 μm in order to absorb most of the visible light. For that reason, when the backside-illuminated imaging device is manufactured, a manufacture sequence is as follows. That is, elements of the charge accumulating areas, CCD, and the like are first formed on the front side of the semiconductor substrate with some thicknesses; a support substrate is adhered to the elements with an adhesive; and then the semiconductor substrate is etched from the back side thereof until the thickness of the semiconductor substrate becomes about 10 μm. After the etching, elements of a color filter, a microlens, and the like in accordance with the elements formed on the front side of the semiconductor substrate is formed on the back side of the semiconductor substrate.

JP-A-2005-285988 discloses a technique for adhering a support substrate to a semiconductor substrate with an adhesive, and then the semiconductor substrate is etched from the back side of the semiconductor substrate.

In order to adhere a semiconductor substrate to a support substrate, an adhesive (epoxy resin) or the like made of an organic material is generally used. There is a technique for directly adhering a semiconductor substrate to a support substrate, but an apparatus for performing the adhering is expensive and the surface of the semiconductor substrate is required to be almost ideally flat. For that reason, troublesome problems arise in that a flattening process by a CMP is necessary, a dummy pattern for reducing a dishing phenomenon is introduced, a dummy pattern shape is optimized, or the like. Therefore, the adhesive made of an organic material is advantageous in terms of manufacturing cost.

In a case of the backside-illuminated imaging device, it is required to form a color filter, a microlens, and the like with high positional precision on the back side of the semiconductor substrate, with reference to a side on which the support substrate is not adhered to the semiconductor substrate. In order to achieve the high positional precision, an appearance of the support substrate attached to the semiconductor substrate is required to be flat to the extent that the support substrate is suspended on a photolithographic equipment such as a stepper. A problem does not occur since the flatness of the support substrate can be achieved as much as the flatness of the semiconductor substrate. However, in a case where the adhesive made of an organic material is interposed between the support substrate and the semiconductor substrate, there is a possibility that minute tilting (flatness error between wafers) occurs between the support substrate and the semiconductor substrate. In the case of the photolithographic equipment capable of making a minuter pattern, a margin is small in unevenness of a focal plane, and in the photolithographic equipment capable of achieving a minimum line width of about 0.2 μm, a photoresist shape formed by the photolithographic equipment may become a quite different shape when unevenness of about several μm occurs in the wafer surface. Accordingly, in order to form the front-side elements and the back-side elements with the high positional precision, the adhering of the support substrate and the semiconductor substrate has to be performed with high precision so as to allow the thickness of a space between the support substrate and the semiconductor substrate to be uniform. In the technique disclosed in JP-A-2005-285988, there is no guarantee that the thickness of the space between the support substrate and the semiconductor substrate is uniform. Accordingly, deterioration in characteristics or yields caused due to the positional mismatch between the front-side elements and the back-side elements may occur. Moreover, color mixture caused due to deformation of the color filter or the microlens shape may increase.

SUMMARY OF THE INVENTION

An object of the invention is to provide a backside-illuminated imaging device capable of realizing improvement in device characteristics, improvement in yield, and reduction in color mixture.

According to an aspect of the invention, there is provided a backside-illuminated imaging device that performs imaging by illuminating light from a back side of a semiconductor substrate to generate electric charges in the semiconductor substrate based on the light and reading out the electric charges from a front side of the semiconductor substrate, the backside-illuminated imaging device including: a back-side layer including an back-side element on the back side of the semiconductor substrate; a front-side layer including an front-side element on the front side of the semiconductor substrate; a support substrate above the front-side layer; a spacer, one end of which comes in contact with the front-side layer and the other end of which comes in contact with the support substrate, to form a space having a uniform distance between the semiconductor substrate and the support substrate; and an adhesive filled in at least a part of the space between the surface-side element formation layer and the support substrate.

In the backside-illuminated imaging device, a surface of the front-side layer may include a plane portion at a uniform distance from a surface of the semiconductor substrate and at a position corresponding to the spacer, and one end of the spacer may come in contact with the plane portion.

In the backside-illuminated imaging device, the support substrate may be a mounting base of the backside-illuminated imaging device.

According to another aspect of the invention, there is provided a method of manufacturing a backside-illuminated imaging device that performs imaging by illuminating light from a back side of a semiconductor substrate to generate electric charges in the semiconductor substrate based on the light and reading out the electric charges from a front side of the semiconductor substrate. The method includes: forming a front-side layer including a front-side element on a front side of the semiconductor substrate; forming a pattern of protrusion portions at respective specific positions of a support substrate that is for supporting the semiconductor substrate; adhering the semiconductor substrate to the support substrate by filling with an adhesive at least a part of a space formed by the protrusion portions between the front-side layer and the support substrate in a state where the protrusion portions come in contact with the front-side surface; and forming a back-side layer including a back-side element on a back side of the semiconductor substrate in a state where the semiconductor substrate and the support substrate are adhered to each other.

In the method of manufacturing a backside-illuminated imaging device, the front-side layer may be formed so that a surface of the front-side layer includes plane portions at a uniform distance from a surface of the semiconductor substrate and at positions corresponding to the respective specific positions, and the filling of the adhesive may be performed in a state where the protrusion portions come in contact with the respective plane portions.

According to still another aspect of the invention, there is provided a method of manufacturing a backside-illuminated imaging device that performs imaging by illuminating light from a back side of a semiconductor substrate to generate electric charges in the semiconductor substrate based on the light and reading out the electric charges from a front side of the semiconductor substrate. The method includes: forming a front-side layer including a front-side element on a front side of the semiconductor substrate; forming a pattern of protrusion portions at respective specific positions on the front-side layer, adhering the semiconductor substrate to a support substrate, which is for supporting the semiconductor, substrate by filling with an adhesive at least a part of a space formed by the protrusion portions between the front-side layer and the support substrate in a state where the protrusion portions come in contact with the support substrate, and forming a back-side layer including a back-side element on a back side of the semiconductor substrate in a state where the semiconductor substrate and the support substrate are adhered to each other.

In the method of manufacturing a backside-illuminated imaging device, the front-side layer may be formed so that a surface of the front-side layer includes plane portions at a uniform distance from a surface of the semiconductor substrate and at positions corresponding to the respective specific positions, and the protrusion portions may be formed on the respective plane portions.

The method of manufacturing a backside-illuminated imaging device may further include: removing the support substrate together with the adhesive from the front-side layer after the forming of the back-side layer; and adhering the semiconductor substrate to a mounting substrate of the backside-illuminated imaging device by filling with an adhesive at least a part of a space formed by the protrusion portions between the front-side layer and the mounting base in a state where the protrusion portions come in contact with the mounting base.

BRIEF DESCRIPTION OF THE DRAWINGS

The features of the invention will appear more fully upon consideration of the exemplary embodiments of the inventions, which are schematically set forth in the drawings, in which:

FIG. 10A is a diagram illustrating the silicon substrate viewed from the front side, and FIG. 10B is a diagram illustrating the support substrate viewed from the surface on which the spacers are formed;

DETAILED DESCRIPTION OF THE EXEMPLARY EMBODIMENTS

According to an exemplary embodiment of the invention, it is possible to provide a backside-illuminated imaging device capable of improving an element property, improving yield, and reducing color mixture.

Hereinafter, exemplary embodiments of the invention will be described with reference to the drawings.

First Embodiment

FIGS. 1 to 7 are schematic sectional views illustrating respective processes of manufacturing a backside-illuminated imaging device according to a first exemplary embodiment of the invention.

Figure 7:
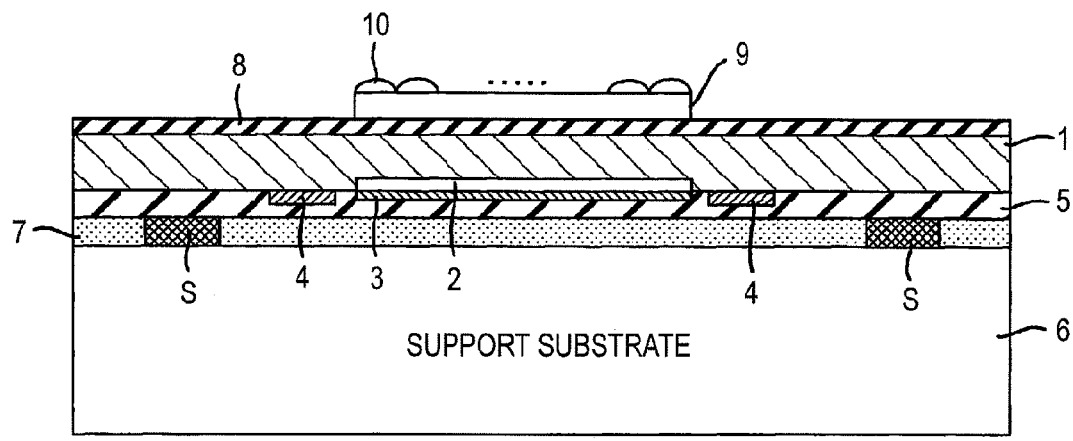
FIG. 7 is a schematic sectional view illustrating one process of manufacturing the backside-illuminated imaging device according to the first embodiment.

In this embodiment, an overall configuration of the backside-illuminated imaging device is shown in FIG. 7. On the front side of a silicon substrate 1, which is an example of a semiconductor substrate, there is formed an element construction 2 such as plural electric charge accumulating areas for accumulating electric charges generated in the silicon substrate 1 and a transmission channel constituted by a CCD for transmitting the electric charges accumulated in the electric charge accumulating area, and a front-side element-containing layer which includes: an element construction 3 such as driving electrodes for driving the transmission channel and various types of wirings; electrode pads 4; and an insulating layer 5 functioning as a protective layer for protecting the elements or as a flatness layer. In addition, on the back side of the silicon substrate 1, there is formed a back-side element-containing layer which includes a flatness layer 8, a color filter 9 for dispersing light incident to each electric charge accumulating area, and microlenses 10 for concentrating light on each electric charge accumulating area. One end of a spacer S comes in contact with the front-side element-containing layer and the other end of the spacer S comes in contact with s support substrate 6. In addition, a space between the front-side containing-element layer and the support substrate 6 fills with an adhesive 7, thereby adhering the silicon substrate 1 and the support substrate 6 to each other.

The backside-illuminated imaging device shown in FIG. 7 uses light incident from the back side of the silicon substrate 1. Light concentrated by the microlenses 10 and dispersed in the color filter 9 is incident to the silicon substrate 1. In addition, electric charges generated in the silicon substrate 1 are accumulated in the electric charge accumulating areas, and the electric charges transmitted by the CCD are output by an amplifier. In the specification, a positional relationship between the constituent elements is defined with reference to the front-side surface and the back-side surface of the silicon substrate 1. For example, with reference to the front-side surface of the silicon substrate 1, an incident light direction is defined as an upward direction of the front-side surface. With reference to the back-side surface of the silicon substrate 1, a direction reverse to the incident light direction is defined as an upward direction of the back-side surface.

In accordance with the definition, the backside-illuminated imaging device includes: the silicon substrate 1; the front-side element-containing layer (the element construction 3, the electrode pads 4, and the insulating layer 5) formed on the front-side surface of the silicon substrate 1; the support substrate 6 made of glass or the like which is formed on the upward side of the insulating layer 5 of the front-side element-containing layer; the spacer S, one end of which comes in contact with the insulating layer 5 of the front-side element-containing layer and the other end of which comes in contact with the support substrate 6; the adhesive filled in the space formed by the spacer S between the insulating layer 5 and the support substrate 6; and the back-side element-containing layer including the flatness layer 8 formed on the back-side surface of the silicon substrate 1, the color filter 9 formed on the flatness layer 8, and the microlenses 10 formed on the color filter 9.

Hereinafter, a method of manufacturing the backside-illuminated imaging device having the above-described configuration will be described with reference to FIGS. 1 to 7.

Figure 1:
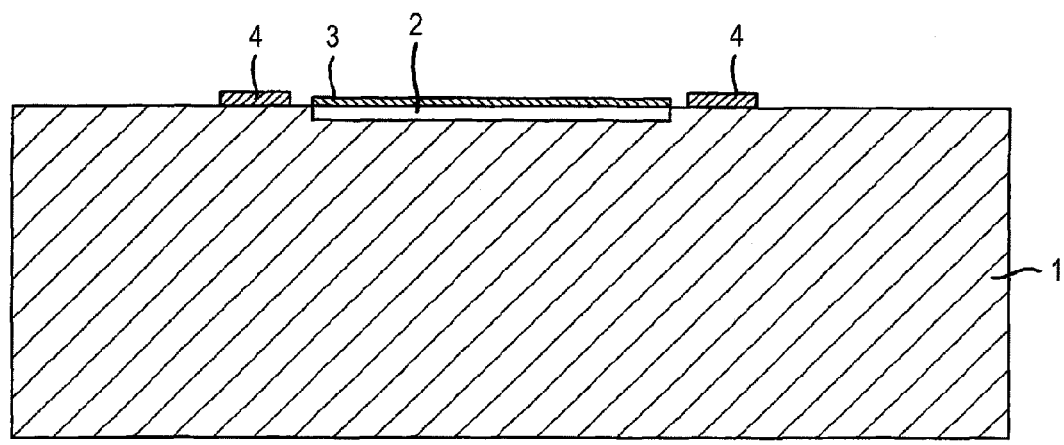
FIG. 1 is a schematic sectional view illustrating one process of manufacturing a backside-illuminated imaging device according to a first exemplary embodiment of the invention.
Figure 2:
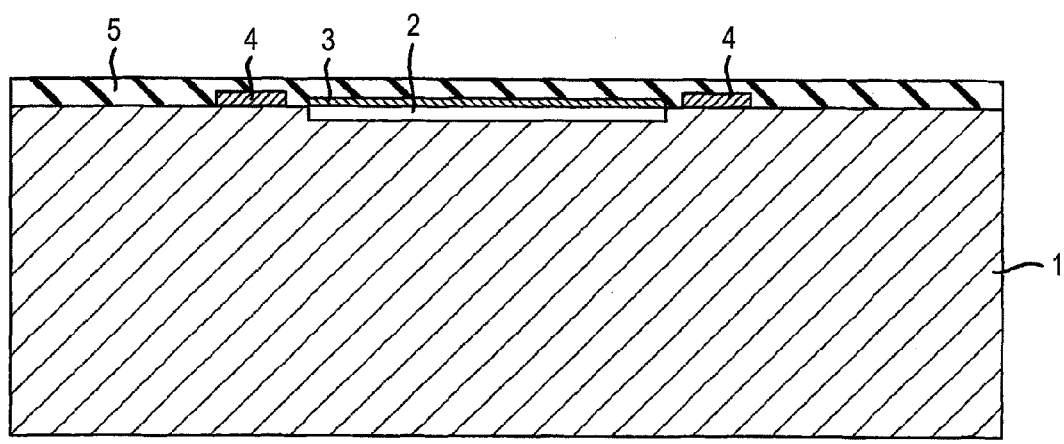
FIG. 2 is a schematic sectional view illustrating one process of manufacturing the backside-illuminated imaging device according to the first embodiment.

First, as shown in FIG. 1, the surface of the silicon substrate 1 is fixed so as to face upward. In addition, the element construction 2 is formed in the surface, and the element construction 3 and the electrode pads 4 are formed on the surface by a known process. Next, as shown in FIG. 2, after a layer made of an insulating material is formed on the silicon substrate 1, the layer is flattened to form the insulating layer 5.

Figure 3:
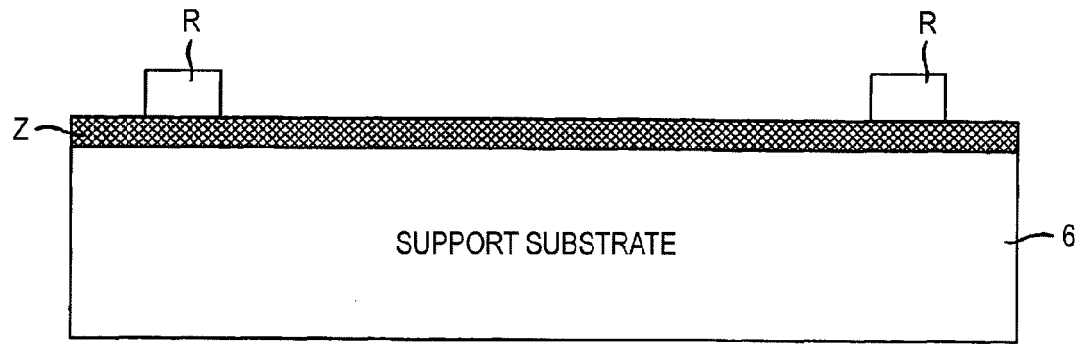
FIG. 3 is a schematic sectional view illustrating one process of manufacturing the backside-illuminated imaging device according to the first embodiment.
Figure 4:
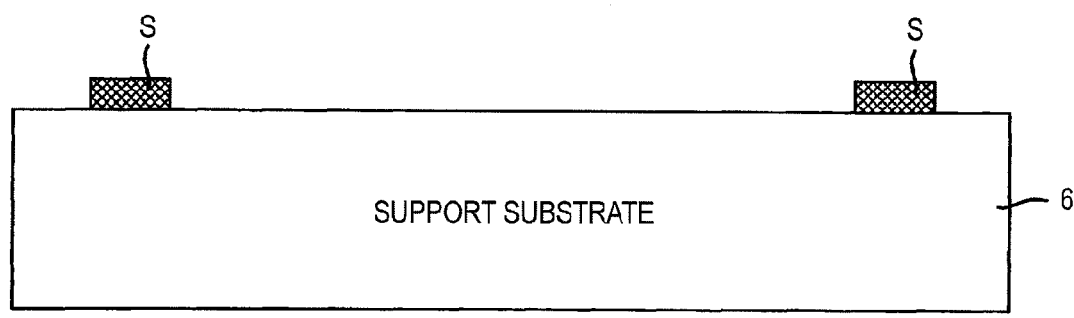
FIG. 4 is a schematic sectional view illustrating one process of manufacturing the backside-illuminated imaging device according to the first embodiment.

Next, as shown in FIG. 3, the support substrate 6 is prepared to form a layer, which is made of a material (for example, a metal material) different from that of the support substrate 6, on the support substrate 6 by means of a method such as CVD or PVD in which a layer very uniform thickness can be formed. Subsequently, resist patterns R are formed only at specific positions of the layer by an exposure process and a development process (photolithography). Next, as shown in FIG. 4, a metal material layer Z is etched using the resist patterns R as a mask, and then the metal material layer Z other than that below the resist patterns R is removed to form the spacers S. Moreover, the process of forming the spacers S on the support substrate 6 may be performed in advance before the elements shown in FIG. 2 are manufactured, or the process may be performed at the same time.

The spacers S are a space for allowing the thickness of the space between the silicon substrate 1 and the support substrate 6 to be uniform. Accordingly, the number and the position of the spacers S are appropriately determined to the extent that the silicon substrate 1 and the support substrate 6 are stably flattened when the support substrate 6 comes in contact with the front-side element-containing layer of the silicon substrate 1 with the spacers S interposed therebetween.

Figure 5:
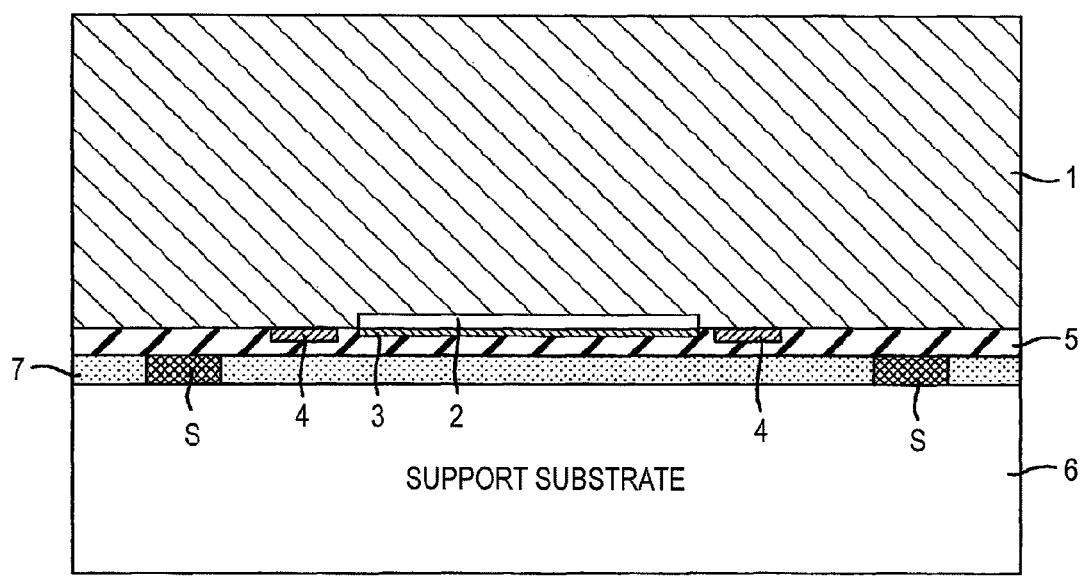
FIG. 5 is a schematic sectional view illustrating one process of manufacturing the backside-illuminated imaging device according to the first embodiment.

Next, as shown in FIG. 5, the silicon substrate 1 is placed on a surface opposite the contact surface of the spacers S with the support substrate 6 so that the insulating layer 5 of the silicon substrate 1 comes in contact with the opposite surfaces. The height of the spacers S is uniform since the spacers S are formed by patterning the material of the layer, which is formed by the method such as CVD or PVD in which a layer very uniform thickness can be formed, by means of photolithography and etching. On the other hand, the surface of the insulating layer 5 coming in contact with the spacers S are flattened, that is, the distance between the surface the insulating layer 5 and the surface of the silicon substrate 1 is uniform. Accordingly, in the state shown in FIG. 5, the thickness of the space between the silicon substrate 1 and the support substrate 6 is uniform in the entire space. In this state, the space formed by the spacers S between the insulating layer 5 and the support substrate 6 fills with an adhesive 7 (for example, an epoxy resin) made of an organic material while a pressure is applied from the back side of the silicon substrate 1. In this way, the silicon substrate 1 and the support substrate 6 are adhered to each other.

In this case, the entire space between the insulating layer 5 and the support substrate 6 may not fill with the adhesive 7 as long as the silicon substrate 1 and the support substrate 6 are sufficiently adhered to each other. Accordingly, at least a part of the space may be filled with the adhesive 7.

Figure 6:
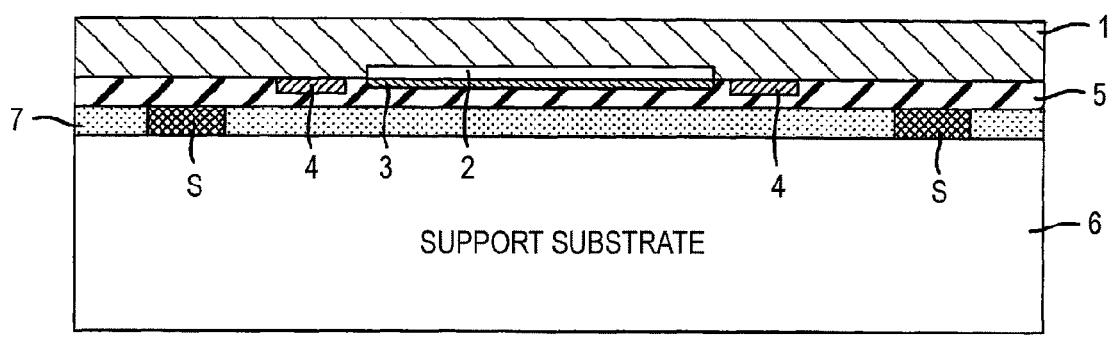
FIG. 6 is a schematic sectional view illustrating one process of manufacturing the backside-illuminated imaging device according to the first embodiment.

Next, as shown in FIG. 6, the silicon substrate 1 is etched from the back side of the silicon substrate 1 with the support substrate 6 fixed, until the thickness of the silicon substrate 1 becomes about 10 μm, for example. Subsequently, as shown in FIG. 7, a layer made of an insulating material such as a resin is formed to form the flatness layer 8 on the back-side surface of the silicon substrate 1. Subsequently, the color filter 9 is formed on the flatness layer 8 by a known process and the microlenses 10 are formed on the color filter 9 by a known process. Subsequently, the constituent element shown in FIG. 7 is packaged to complete the manufacturing of the backside-illuminated imaging device.

According to the above-described method, since the distance between the silicon substrate 1 and the support substrate 6 is uniform at any position, it is possible to improve precision for the position and the shape of the elements of the back-side element-containing layer, compared with a device disclosed in JP-A-2005-285988. As a result, it is possible to improve device characteristics, improve yield, and reduce color mixture.

Figure 8:
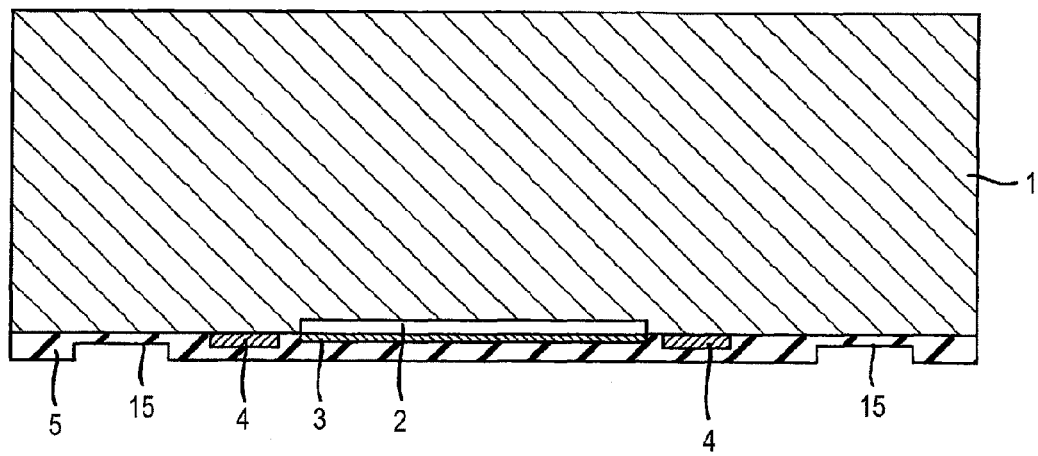
FIG. 8 is a schematic sectional view illustrating a modified example of the process of manufacturing the backside-illuminated imaging device according to the first embodiment.
Figure 9:
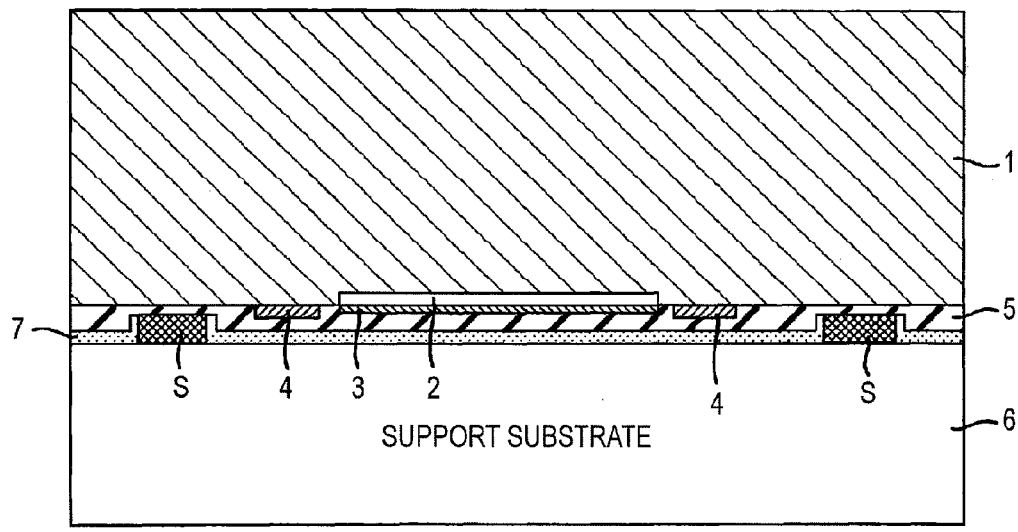
FIG. 9 is a schematic sectional view illustrating the modified example of the process of manufacturing the backside-illuminated imaging device according to the first embodiment.

In this embodiment, the surface of the front-side element-containing layer is flattened, but cannot be flattened in some cases. In these cases, when the front-side element-containing layer is formed, for example, as shown in FIG. 8, the configuration of the front-side element-containing layer may be designed so that surfaces 15 of which the distance from the surface of the silicon substrate 1 is uniform are formed at specific positions of the surface of the front-side element-containing layer. In addition, as shown in FIG. 9, the silicon substrate 1 is placed on the spacers S of the support substrate 6 so that the spacers S formed on the support substrate 6 come in contact with the surfaces 15. In addition, the adhering is performed by filling with adhesive 7 while applying a pressure.

Figure 10A:
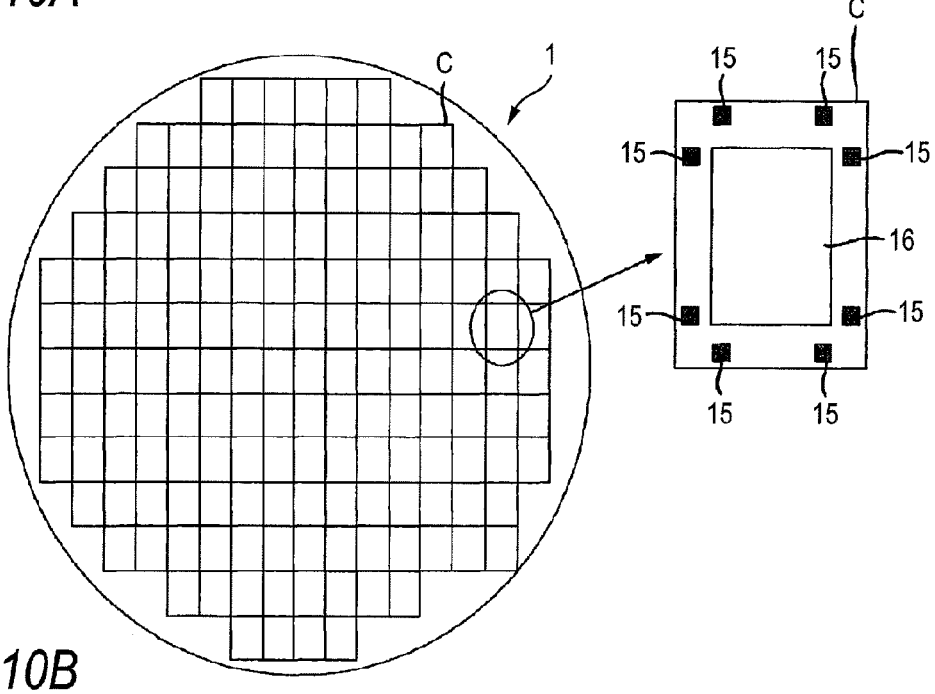
FIGS. 10A and 10B are schematic top views illustrating the entire silicon substrate and the entire support substrate.
Figure 10B:
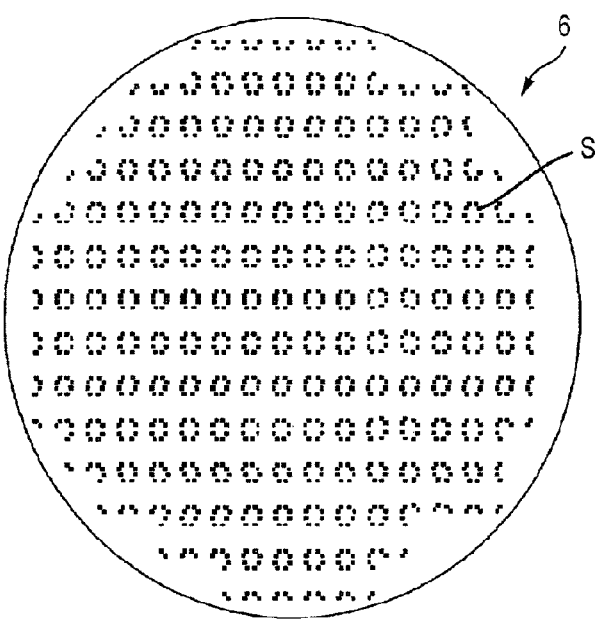

FIGS. 10A and 10B are schematic top views illustrating the entire silicon substrate and the entire support substrate. FIG. 10A is a diagram illustrating the silicon substrate 1 viewed from the front side and FIG. 10B is a diagram illustrating the support substrate 6 viewed from the surface on which the spacers S are formed.

In a case where a front-side element-containing layer 16 is formed at the center of a tip area C, which is an area where the backside-illuminated imaging device is formed, as shown in FIG. 10A, the surfaces 15 are formed so as to surround the surface-side element formation layer 16 and the spacers S are formed at the positions corresponding to the surfaces 15 in the support substrate 6, as shown in FIG. 10B. In addition, the silicon substrate 1 shown in FIG. 10A and the support substrate 6 shown in FIG. 10B are adhered to each other, so that the silicon substrate 1 and the support substrate 6 can be parallel to each other.

Second Embodiment

FIGS. 11 to 15 are schematic sectional views illustrating respective processes of manufacturing a backside-illuminated imaging device according to a second exemplary embodiment of the invention.

Figure 11:
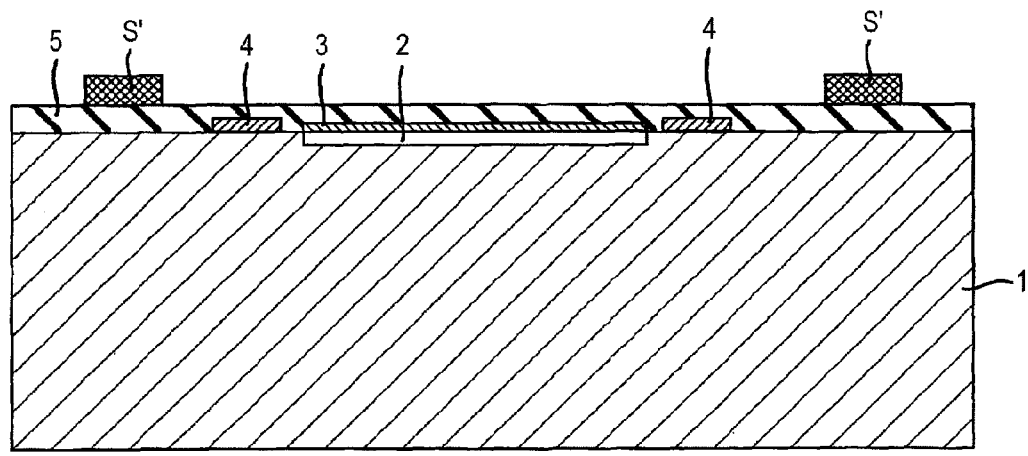
FIG. 11 is a schematic sectional view illustrating one process of manufacturing a backside-illuminated imaging device according to a second exemplary embodiment of the invention.

First, the elements shown in FIG. 2 are formed in the same way as that described according to the first embodiment. Next, as shown in FIG. 11, spacers S' (protrusion pattern) are formed at specific positions on the insulating layer 5 by photolithography and etching. That is, a layer made of a material (for example, a metal material) different from that of the insulating layer 5 is formed on the insulating layer 5 by a method such as CVD or PVD in which a layer very uniform thickness can be formed. Subsequently, resist mask patterns are formed on the metal material layer by an exposure process and a development process, and then the metal material layer is etched using the mask patterns. In this way, the spacers S' are formed.

Figure 12:
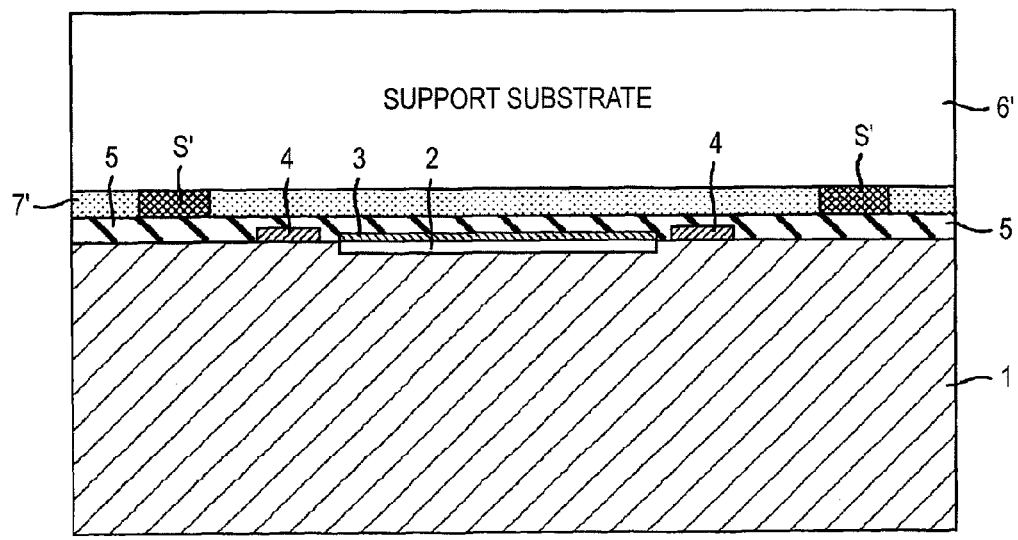
FIG. 12 is a schematic sectional view illustrating one process of manufacturing the backside-illuminated imaging device according to the second embodiment.

Next, as shown in FIG. 12, a support substrate 6' is placed on a surface opposite the contact surface of the spacers S' with the insulating layer 5 so that the support substrate 6' made of glass or the like comes in contact with the opposite surface. The height of the spacers S' is uniform since the spacers S' are formed by patterning the film, which is formed by the method such as CVD or PVD in which a layer very uniform thickness can be formed, by photolithography and etching. In addition, the surface of the insulating layer 5 coming in contact with the spacers S' are flattened, that is, the surface is at a uniform distance from the surface of the silicon substrate 1. Accordingly, in the state shown in FIG. 12, the thickness of the space between the silicon substrate 1 and the support substrate 6' is all uniform. At this state, the space formed by the spacers S' between the insulating layer 5 and the support substrate 6' fills with an adhesive 7' (for example, an epoxy resin) made of an organic material while a pressure is applied to the support substrate 6'. In this way, the silicon substrate 1 and the support substrate 6' are adhered to each other.

In this case, the entire space may not fill with the adhesive 7' as long as the silicon substrate 1 and the support substrate 6' are sufficiently adhered to each other. Accordingly, at least a part of the space between the insulating layer 5 and the support substrate 6' may be filled with the adhesive 7'.

Like the spaces S, the spaces S' are spaces for allowing the thickness of the space between the silicon substrate 1 and the support substrate 6' to be uniform. Accordingly, the number and the position of the spacers S' are appropriately determined to the extent that the silicon substrate 1 and the support substrate 6' are stably flattened when the silicon substrate 1 comes in contact with the support substrate 6' with the spacers S' interposed therebetween.

Figure 13:
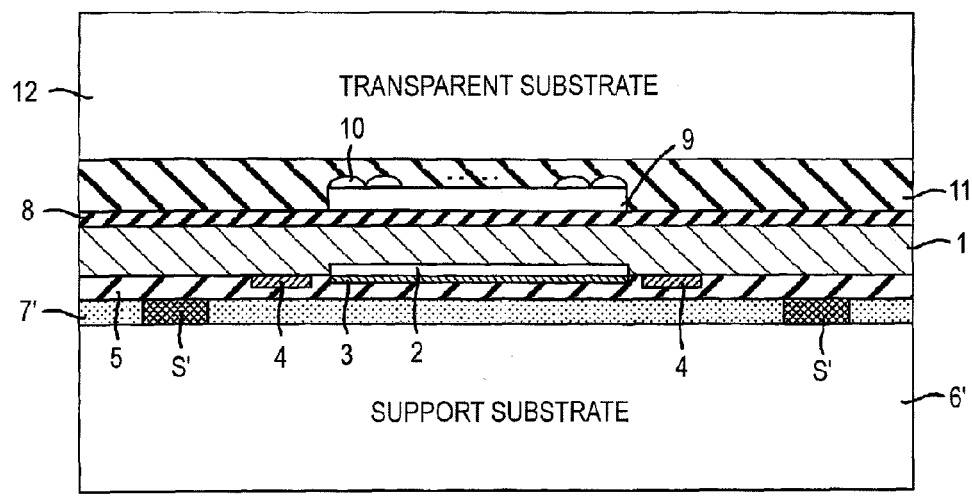
FIG. 13 is a schematic sectional view illustrating one process of manufacturing the backside-illuminated imaging device according to the second embodiment.

Next, in the same way as that described according to the first embodiment, the back-side surface of the silicon substrate 1 is etched so as to have the thickness of 10 μm. Subsequently, a flatness layer 8 is formed on the back-side surface of the silicon substrate 1, a color filter 9 is formed on the flatness layer 8, and microlenses 10 are formed on the color filter 9. Next, as shown in FIG. 13, a protective layer 11 made of a transparent resin material for protecting the color filter 9 and the microlenses 10 is formed, an adhesive made of an organic material is coated on the protective layer 11, and a transparent substrate 12 made of glass or the like is adhered to the protective layer 11 with the adhesive interposed therebetween.

Figure 14:
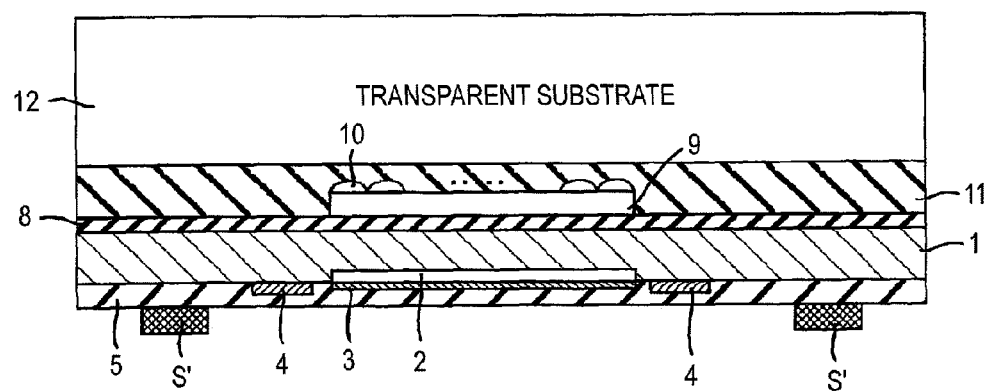
FIG. 14 is a schematic sectional view illustrating one process of manufacturing the backside-illuminated imaging device according to the second embodiment.
Figure 15:
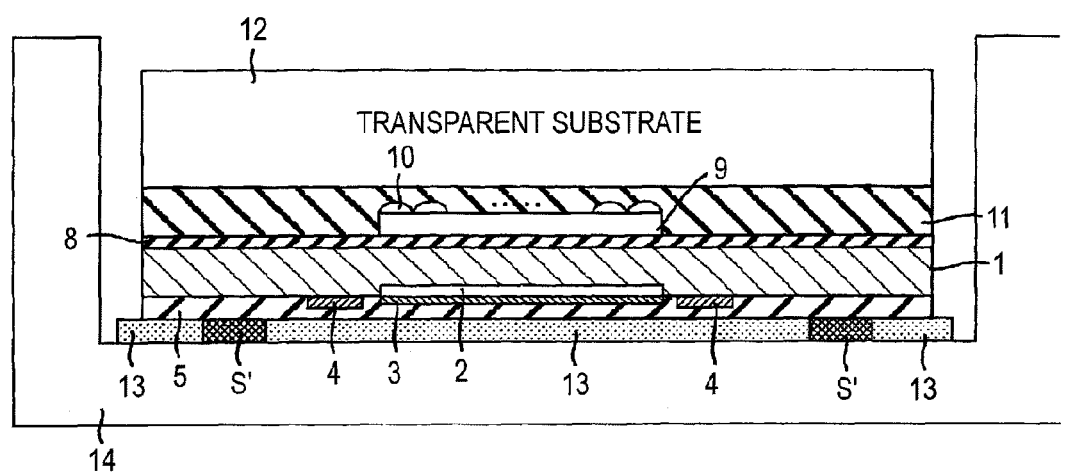
FIG. 15 is a schematic sectional view illustrating one process of manufacturing the backside-illuminated imaging device according to the second embodiment.

Next, as shown in FIG. 14, the support substrate 6' as well as the adhesive 7' is removing from the insulating layer 5. Next, as shown in FIG. 15, a mounting base 14 is prepared such as a package body for housing the backside-illuminated imaging device or a circuit substrate on which a driving circuit or a signal processing circuit for driving the backside-illuminated imaging device is formed. At this time, by filling the space formed by the spacers S' between the insulating layer 5 and the mounting base 14 with an adhesive 13 (for example, an epoxy resin) made of an organic material, the silicon substrate 1 is attached to the mounting base 14 with the spacers S' coming in contact with the mounting base 14.

In this case, the entire space may not fill with the adhesive 13 as long as the silicon substrate 1 and the mounting base 14 are sufficiently adhered to each other. Accordingly, at least a part of the space between the insulating layer 5 and the mounting base 14 may be filled with the adhesive 13.

With such a method, it is possible to improve precision for the position and the shape of the constituent elements of the back-side element-containing layer since the back-side element-containing layer can be formed so that the distance between the silicon substrate 1 and the support substrate 6' is all uniform, compared with a device disclosed in JP-A-2005-285988. As a result, it is possible to improve device characteristics, improve yield, and reduce color mixture.

With such a method, the silicon substrate 1 can be parallel to the element mounting surface of the mounting base 14 since the silicon substrate 1 and the mounting base 14 are adhered by the adhesive 13 with the spacers S' interposed therebetween. As a result, when the backside-illuminated imaging device is mounted in a camera, it is possible to eliminate mismatch with a camera optical system.

After the elements shown in FIG. 13 are formed, the elements can be packaged to complete the backside-illuminated imaging device. In this case, however, the support substrate 6' may be tilted to the element mounting surface of the mounting base when the support substrate 6' is adhered to the mounting base. In order to prevent such a situation, it is effective to use the above-described method.

In this embodiment, in a case where the surface of the front-side element-containing layer is not flat, the front-side element-containing layer may be configured so that surfaces 15 which are at a uniform distance from the surface of the silicon substrate 1 are formed at specific positions, as shown in FIG. 8, when the front-side element-containing layer is formed. Then, the method of forming the spacers S' on the surfaces 15 may be used.

In the first and second embodiments, the backside-illuminated imaging device is of the CCD type, but may be of a COMS type. In this case, the front-side element-containing layer may be formed of elements which are necessary for the CMOS type.

What is claimed is:

1. A backside-illuminated imaging device that performs imaging by illuminating light from a back side of a semiconductor substrate to generate electric charges in the semiconductor substrate based on the light and reading out the electric charges from a front side of the semiconductor substrate, the backside-illuminated imaging device comprising: a back-side layer including a back-side element on the back side of the semiconductor substrate; a front-side layer including a front-side element on the front side of the semiconductor substrate; a support substrate above the front-side layer; a spacer, one end of which comes in physical contact with the front-side layer and the other end of which comes in physical contact with the support substrate, to form a space having a uniform distance between the semiconductor substrate and the support substrate; and an adhesive filled in at least a part of the space between the front-side element formation layer and the support substrate.

2. The backside-illuminated imaging device according to claim 1, wherein a surface of the front-side layer includes a plane portion at a uniform distance from a surface of the semiconductor substrate and at a position corresponding to the spacer, and one end of the spacer comes in contact with the plane portion.

3. The backside-illuminated imaging device according to claim 1, wherein the support substrate is a mounting base of the backside-illuminated imaging device.

* * * * *